United States Patent
Meyer-Berg

(10) Patent No.: US 8,338,231 B2
(45) Date of Patent: Dec. 25, 2012

(54) ENCAPSULATED SEMICONDUCTOR CHIP WITH EXTERNAL CONTACT PADS AND MANUFACTURING METHOD THEREOF

(75) Inventor: Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 114 days.

(21) Appl. No.: 12/749,192

(22) Filed: Mar. 29, 2010

(65) Prior Publication Data

US 2011/0233754 A1 Sep. 29, 2011

(51) Int. Cl.
*H01L 29/66* (2006.01)
(52) U.S. Cl. ........ 438/108; 438/124; 438/612; 257/678; 257/E21.502; 257/E23.142
(58) Field of Classification Search .................. 257/666, 257/678, 680, 684, 686, 687, 689, 690, 693, 257/698, 699, 700, 701, 707, 708, 713, 723, 257/766, 777, E21.502, E23.142; 438/106, 438/108, 124, 127, 612
See application file for complete search history.

(56) References Cited

U.S. PATENT DOCUMENTS

| 7,598,117 | B2 * | 10/2009 | Kurita et al. | 438/106 |
| 7,638,879 | B2 * | 12/2009 | Jiang et al. | 257/766 |
| 2005/0161833 | A1 | 7/2005 | Takeuchi et al. | |
| 2005/0258547 | A1 * | 11/2005 | Terui | 257/777 |
| 2006/0208356 | A1 * | 9/2006 | Yamano et al. | 257/734 |
| 2009/0230535 | A1 | 9/2009 | Otremba et al. | |
| 2010/0148360 | A1 * | 6/2010 | Lin et al. | 257/737 |
| 2010/0237495 | A1 * | 9/2010 | Pagaila et al. | 257/700 |

FOREIGN PATENT DOCUMENTS

DE 10 2009 012 524 A1 10/2009

OTHER PUBLICATIONS

Kumbhat, N., et al., "Highly-Reliable, 30 μm Pitch Copper Interconnects Using Nano-ACF/NCF," 59th Electronic Components and Technology Conference, 2009, 9 pages.

Lee, B-W, et al., "Chip-last Embedded Active for System-On-Package (SOP)," Proceedings of the 57th Electronic Components and Technology Conference, 2007, 8 pages.

* cited by examiner

*Primary Examiner* — William D Coleman
*Assistant Examiner* — Su Kim
(74) *Attorney, Agent, or Firm* — Slater & Matsil, L.L.P.

(57) ABSTRACT

A method includes providing a carrier; applying a dielectric layer to the carrier; applying a metal layer to the dielectric layer; placing a first semiconductor chip on the metal layer with contact pads of the first semiconductor chip facing the metal layer; covering the first semiconductor chip with an encapsulation material; and removing the carrier.

22 Claims, 8 Drawing Sheets ial layers may, for example, be in the form of a layer covering an area.

ENCAPSULATED SEMICONDUCTOR CHIP WITH EXTERNAL CONTACT PADS AND MANUFACTURING METHOD THEREOF

TECHNICAL FIELD

This invention relates to an encapsulated semiconductor chip with external contact pads. Furthermore, the invention relates to a method of manufacturing such a device.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Moreover, the package contains one or more metal layers in order to provide electrical access to the semiconductor chips from outside of the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1A:
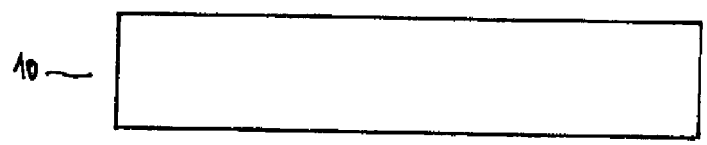
FIGS. 1A-1F schematically illustrate a cross-sectional view of one embodiment of a method of manufacturing a device including providing a carrier, applying a dielectric layer, a metal layer and a semiconductor chip to the carrier and removing the carrier.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones, etc. The semiconductor chips may be configured as antennas and/or discrete passives and/or chip stacks. Semiconductor chips in which such functional elements are embedded generally contain electronic circuits which serve for driving the functional elements or further process signals generated by the functional elements. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals.

The semiconductor chips may have contact pads (or electrodes or contact elements) which allow electrical contact to be made with the integrated circuits included in the semiconductor chips. The contact pads may include one or more metal layers which are applied to the semiconductor material of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

One or more metal layers having the shape of conductor lines (or conductor tracks) may be provided and may be electrically coupled to the semiconductor chip. The metal layers may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example, aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The devices described below include external contact pads (or external contact elements), which may be of any shape and size. The external contact pads may be accessible from outside the devices and may thus allow electrical contact to be made with the semiconductor chips from outside the devices. Furthermore, the external contact pads may be thermally conducting and may serve as heat sinks for dissipating the heat generated by the semiconductor chips. The external contact pads may be composed of any desired electrically conductive material, for example, of a metal, such as copper, aluminum or gold, a metal alloy or an electrically conductive organic material. The external contact pads may be formed by portions of the metal layers. Solder material, such as solder balls or solder bumps, may be deposited on the external contact pads.

The semiconductor chips or at least parts of the semiconductor chips may be covered with an encapsulation material, which may be electrically insulating and which may form an encapsulation body. The encapsulation material may be any appropriate duroplastic, thermoplastic or thermosetting material or laminate (prepreg) and may contain filler materials. Various techniques may be employed to encapsulate the semiconductor chips with the encapsulation material, for example, compression molding, injection molding, powder molding, liquid molding or lamination. Heat and/or pressure may be used to apply the encapsulation material.

The encapsulation material may be used to produce fan-out type packages. In a fan-out type package at least some of the external contact pads and/or conductor lines connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards, etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

Figure 1B:
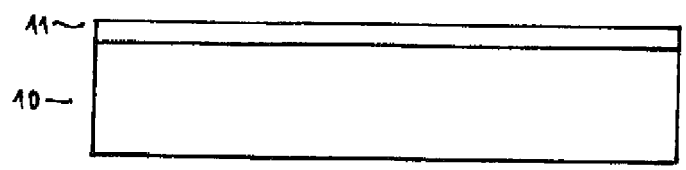
Figure 1C:
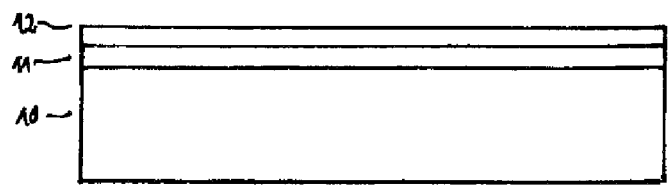
Figure 1D:
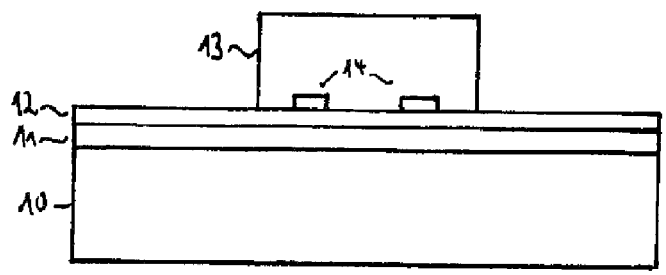
Figure 1E:
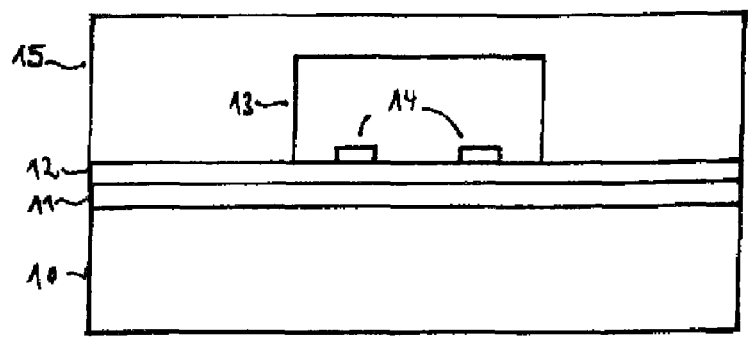
Figure 1F:
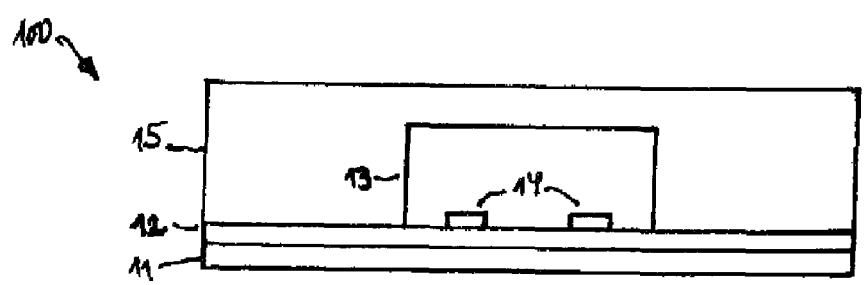

FIGS. 1A-1F schematically illustrate a method for manufacturing a device 100. A cross section of the device 100 obtained by the method is shown in FIG. 1F. As shown in FIG. 1A a carrier 10 is provided. A dielectric layer 11 is applied to the carrier 10 as shown in FIG. 1B. A metal layer 12 is applied to the dielectric layer 11 as shown in FIG. 1C. FIG. 1D shows that a semiconductor chip 13 is placed on the metal layer 12. The semiconductor chip 13 has contact pads 14 which face the metal layer 12 when placing the semiconductor chip 13 on the metal layer 12. The semiconductor chip 13 is then covered with an encapsulation material 15 as shown in FIG. 1E. Afterwards the carrier 10 is removed as shown in FIG. 1F.

Figure 2:
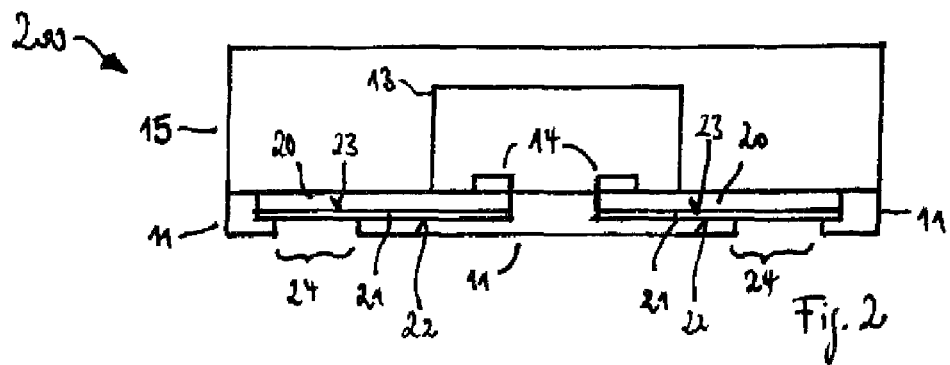
FIG. 2 schematically illustrates a cross-sectional view of one embodiment of a device including a seed layer forming external contact pads, a metal layer applied to the seed layer and a semiconductor chip being in contact with the metal layer.

FIG. 2 schematically illustrates a device 200 in cross section. The device 200 includes a seed layer 21 with a first face 22 and a second face 23 opposite to the first face 22. Portions of the first face 22 of the seed layer 21 form external contact pads 24. A galvanically grown metal layer 20 is applied to the second face 23 of the seed layer 21. The device 200 further includes a semiconductor chip 13 with contact pads 14. The contact pads 14 are in contact with the galvanically grown metal layer 20. The semiconductor chip 13 may be covered with an encapsulation material 15 forming an encapsulation body.

Figure 3A:
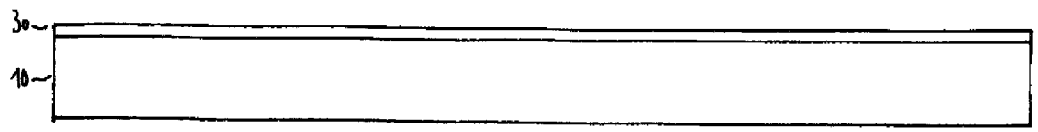
FIGS. 3A-3K schematically illustrate a cross-sectional view of one embodiment of a method of manufacturing a device including providing a carrier, applying a seed layer to the carrier, galvanically depositing a metal layer on the seed layer and mounting a semiconductor chip on the metal layer.
Figure 3B:
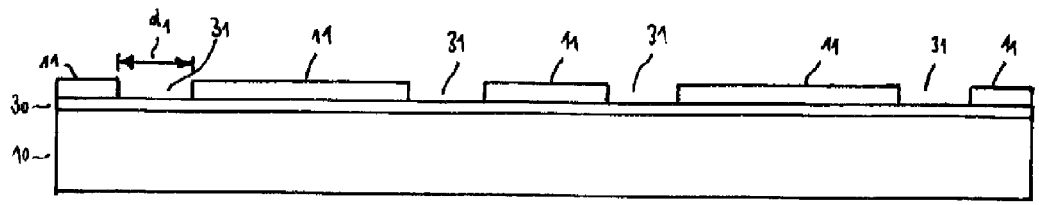
Figure 3C:
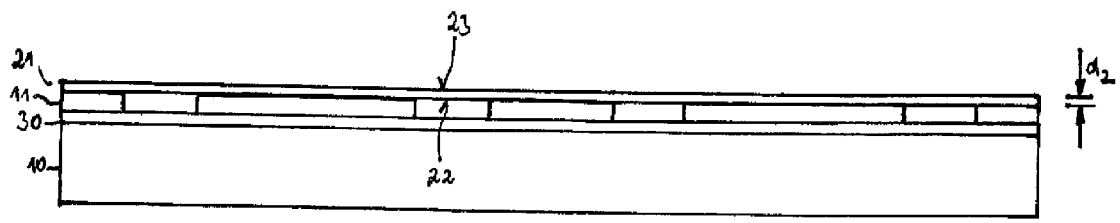
Figure 3D:
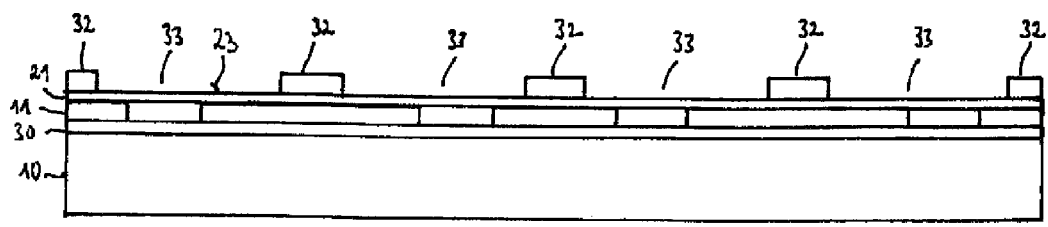
Figure 3E:
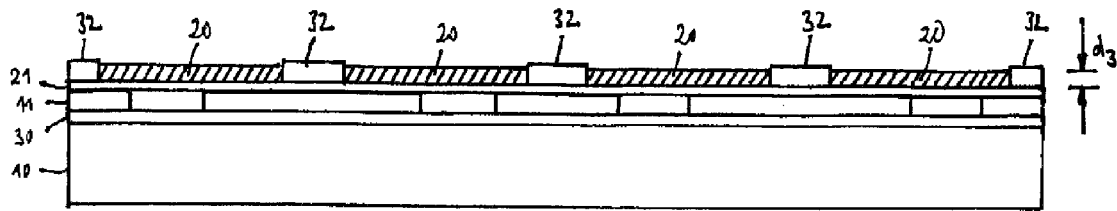
Figure 3F:
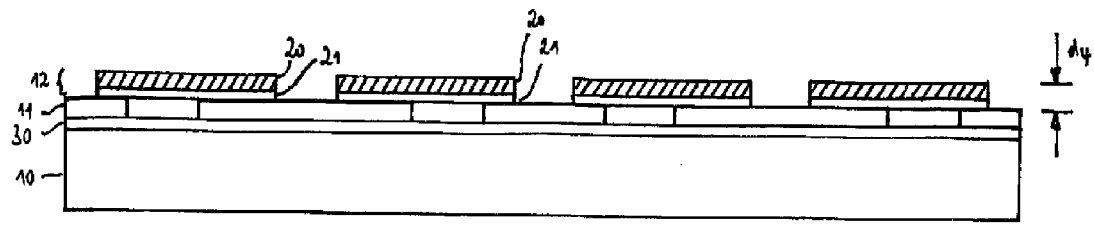
Figure 3G:
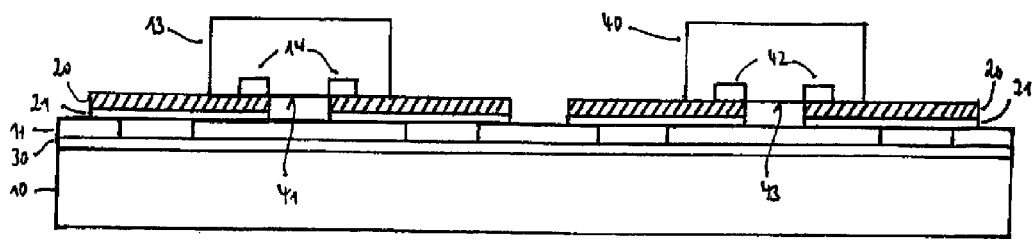
Figure 3H:
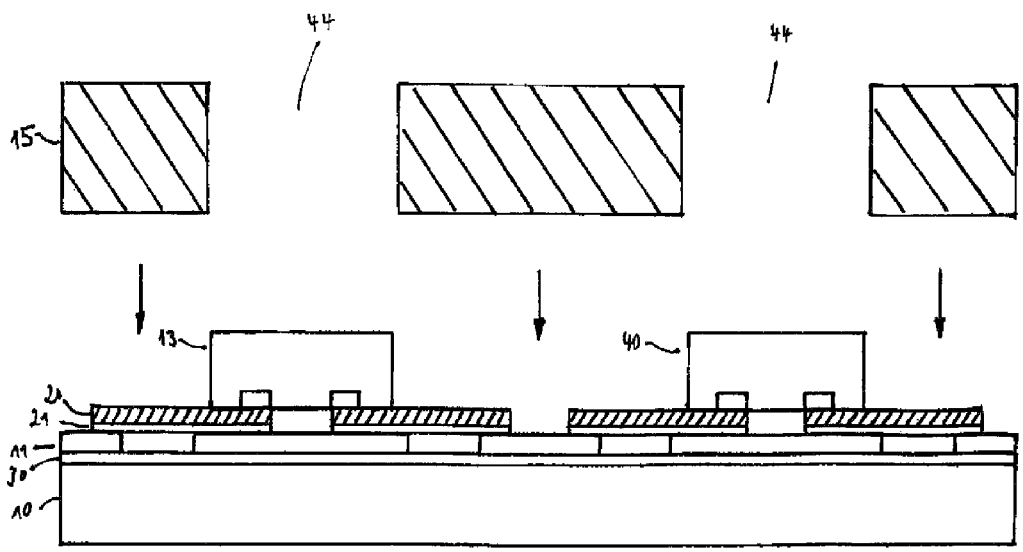
Figure 3I:
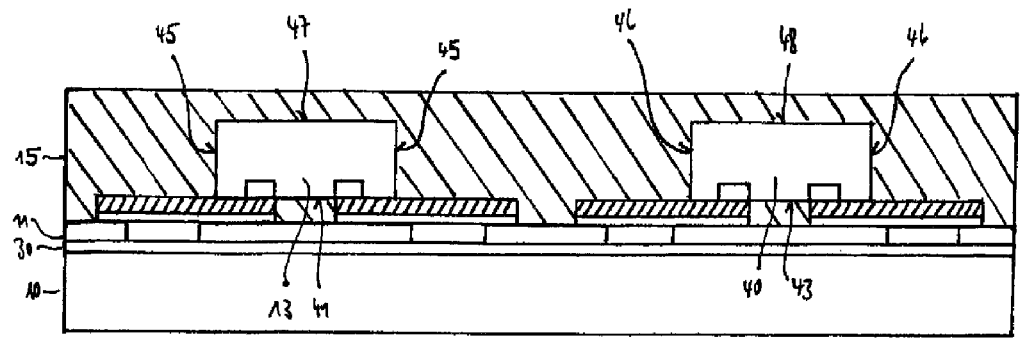
Figure 3J:
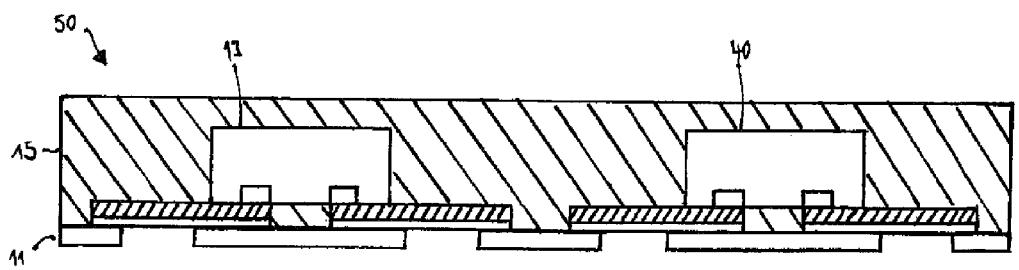
Figure 3K:
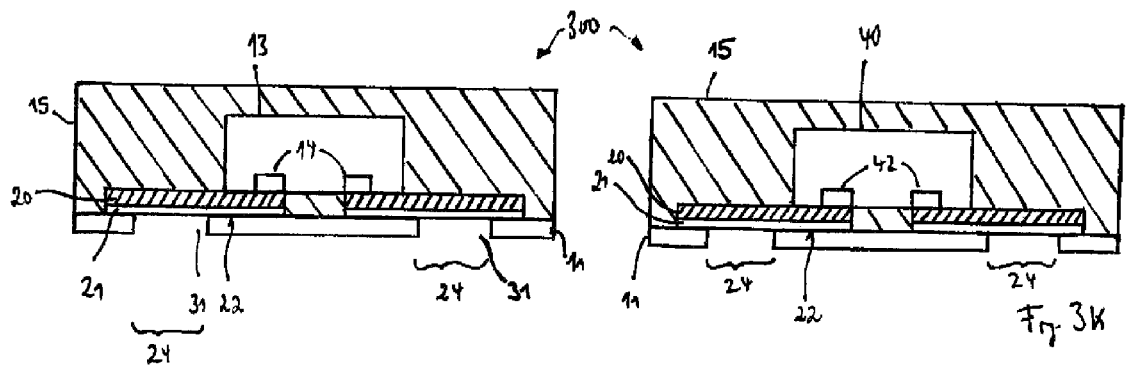

FIGS. 3A-3K schematically illustrate a method for manufacturing a device 300, a cross section of which is shown in FIG. 3K. The method shown in FIGS. 3A-3K is an implementation of the method shown in FIGS. 1A-1F. The details of the production method that are described below can therefore be likewise applied to the method of FIGS. 1A-1F. Furthermore, the device 300 is an implementation of the device 200 shown in FIG. 2. The details of the device 300 that are described below can therefore be likewise applied to the device 200.

FIG. 3A schematically illustrates a carrier 10 that may be a plate made of a rigid material, for example, a metal, such as nickel, steel or stainless steel, laminate, film or a material stack. The carrier 10 may have at least one flat face on which components of the device 300 can be placed. The shape of the carrier 10 is not limited to any geometric shape, for example, the carrier 10 may be round or square-shaped. The carrier 10 may have any appropriate size.

An adhesive tape 30, for example, a double sided sticky tape, may be laminated onto the carrier 10. The function of the adhesive tape 30 is to provide a releasable fixation of the components placed on the carrier 10 during the subsequent processing steps. Instead of the adhesive tape 30, any other suitable means may be employed which serves the same function. For this purpose, the carrier 10 may have a certain coating, for example, a gold or teflon coating which allows to release the carrier 10 from the components which are placed on the carrier 10.

FIG. 3B schematically illustrates a dielectric layer 11 which is deposited on the adhesive tape 30. The dielectric layer 11 may be fabricated in various ways. For example, the dielectric layer 11 may be deposited from a gas phase or from a solution, or can be printed or laminated on the carrier 10. Furthermore, thin-film technology methods or a standard PCB industry process flow can be used for the application of the dielectric layer 11. The dielectric layer 11 may be fabricated from a polymer, such as parylene, photoresist material, imide, epoxy, epoxy resin, duroplast, silicone, silicon nitride or an inorganic, ceramic-like material, such as silicone-carbon compounds. The thickness of the dielectric layer 11 may be up to 10 µm or even higher.

The dielectric layer 11 may have through-holes 31, which may be round or square-shaped or may have any other geometry. A diameter $d_1$ of the through-holes 31 may be in the range from 100 to 400 µm or may also be outside this range. The through-holes 31 in the dielectric layer 11 may, for example, be produced by using photolithographic methods and/or etching methods after the deposition of the dielectric layer 11. According to one embodiment, the dielectric layer 11 already includes the through-holes 31 when the dielectric layer 11 is deposited. In this case, the dielectric layer 11 may be deposited by using lamination, printing or any other appropriate technique.

FIG. 3C schematically illustrates a seed layer 21, which is placed over the dielectric layer 11. The seed layer 21 may, for example, be a metal foil made of, for example, copper, platinum, palladium or titanium or any other suitable metal or metal alloy. A thickness $d_2$ of the seed layer 21 may be in the range from 500 nm to 3 μm or may be outside this range. The seed layer 21 may be deposited by laminating the metal foil onto the dielectric layer 11 using heat and/or pressure.

The seed layer 21 has a first face 22, which faces the dielectric layer 11, and a second face 23 opposite to the first face 22. Both faces 22 and 23 of the seed layer 21 may be essentially planar. The thickness of the seed layer 21 may be increased by depositing a metal layer on the second face 23 of the seed layer 21, for example, by galvanic deposition. For this purpose a plating resist may be deposited on the second face 23 of the seed layer 21.

FIG. 3D schematically illustrates a photoresist layer 32 which may be printed, electro-deposited or spin-coated on the second face 23 of the seed layer 21. By exposure to light having a suitable wavelength through a mask and subsequent development or laser application, recesses 33 are formed in the photoresist layer 32.

FIG. 3E schematically illustrates a metal layer 20 which is galvanically grown and reinforces the portions of the seed layer 21, which are exposed by the recesses 33 in the photoresist layer 32. Copper or other metals or metal alloys may be used as the material for the metal layer 20. During the galvanic deposition of the metal material, the seed layer 21 may be employed as an electrode. A thickness $d_3$ of the metal layer 20 may be greater than 3 μm.

FIG. 3F schematically illustrates that after the plating of the metal layer 20 the photoresist layer 32 is stripped away by using an appropriate solvent. The now exposed portions of the seed layer 21, which have not been covered with the metal layer 20, may be removed by a brief etching step thereby creating a structured metal layer 12 as illustrated in FIG. 3F.

In a direction parallel to the main face of the carrier 10, the structured metal layer 12 consists of separated conductor lines, and in a direction orthogonal to the main face of the carrier 10 the structured metal layer 12 consists of the seed layer 21, which is directly attached to the dielectric layer 11, and the galvanically grown metal layer 20, which is directly attached to the seed layer 21. The metal layer 12 has a thickness $d_4$, which is usually greater than 3 μm and, in particular, greater than 6 μm.

According to one embodiment, the metal layer 12 consists of only one metal layer (not illustrated). In this embodiment, the metal layer 12 may be laminated as a foil having a thickness $d_4$ onto the dielectric layer 11. Subsequently, the metal layer 12 may be structured using photolithographic and etching methods or other appropriate techniques.

FIG. 3G schematically illustrates a first semiconductor chip 13 and a second semiconductor chip 40, which are mounted on the top face of the galvanically grown metal layer 20. The first semiconductor chip 13 has contact pads 14 arranged on a first main face 41 of the first semiconductor chip 13. The second semiconductor chip 40 has contact pads 42 arranged on a first main face 43 of the second semiconductor chip 40. The first main faces 41, 43 face the metal layer 20, and the contact pads 14, 42 may be electrically coupled to a respective one of the conductor lines of the metal layer 20.

Although only two semiconductor chips 13, 40 are shown in FIG. 3G, any number of semiconductor chips may be mounted on the metal layer 20. For example, more than 50 or 500 or 1000 semiconductor chips may be placed on the carrier 10. The semiconductor chips may, for example, be arranged in an array. The semiconductor chips are relocated on the carrier 10 in larger spacing as they have been in the wafer bond. The semiconductor chips may have been manufactured on the same semiconductor wafer, but may alternatively have been manufactured on different semiconductor wafers. Furthermore, the semiconductor chips may be physically identical, but may also contain different integrated circuits and/or represent other components.

The electrical connection between the contact pads 14, 42 of the semiconductor chips 13, 40 and the metal layer 20 may, for example, be produced by reflow soldering, vacuum soldering, diffusion soldering, sintering, adhesive bonding by means of an electrically conductive adhesive or other appropriate techniques.

In case of a soldering process, solder deposits may be placed on the contact pads 14, 42 of the semiconductor chips 13, 40 before the semiconductor chips 13, 40 are mounted on the metal layer 20. Alternatively, the solder deposits may be placed on the metal layer 20. If the semiconductor chips 13, 40 are adhesively bonded to the metal layer 20, it is possible to use conductive adhesives which may be based on epoxy resins and be enriched with gold, silver, nickel or copper in order to produce the electrical conductivity. As a further alternative, a paste containing metal (nano-) particles may be deposited on the contact pads 14, 42. The metal particles may, for example, be made of a metal, such as silver, gold, copper, tin or nickel. At least a fraction of the metal particles may have diameters smaller than 100 nm or 50 nm or 10 nm. The metal particles may be heated to a temperature below the melting temperature of the metal they are made of. The temperature may be high enough to initiate a sintering process, thereby forming a sintered layer between the contact pads 14, 42 and the metal layer 20. The layer of the sintered metal particles then provides an electrical coupling between the contact pads 14, 42 and the metal layer 20.

FIG. 3H schematically illustrates an encapsulation material 15 which is used to encapsulate the semiconductor chips 13, 40. In the embodiment shown in FIG. 3H, the encapsulation material 15 has the shape of a sheet made of an electrically insulating polymer material. The polymer material may, for example, be a prepreg (short for preimpregnated fibers) that is a combination of a fiber mat, for example, glass or carbon fibers, and a resin, for example, a duroplastic material. Prepreg materials are usually used to manufacture PCBs (printed circuit boards). Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5.

The encapsulation material 15 having the shape of a sheet as shown in FIG. 3H may have through-holes 44. The encapsulation material 15 is placed over the carrier 10 such that the semiconductor chips 13, 40 are arranged in the through-holes 44 of the encapsulation material 15. The encapsulation material 15 may be laminated on the underlying structure by applying heat and pressure for a suitable time.

FIG. 3I schematically illustrates the encapsulation material 15 after it has been laminated on the carrier 10 to form an encapsulation body. The encapsulation material 15 may not only cover side faces 45, 46 of the semiconductor chips 13, 40, but also second main faces 47, 48 of the semiconductor chips 13, 40. The second main faces 47, 48 are located opposite to the first main faces 41, 43, respectively.

According to one embodiment, the encapsulation material 15 is a duroplastic or thermosetting mold material. In this case, the encapsulation material 15 may be based on an epoxy material and may contain a filling material consisting of small particles of glass ($SiO_2$) or other electrically insulating mineral filler materials like $Al_2O_3$ or organic filler materials. The mold material may, for example, be applied by compression molding, injection molding, granulate molding, powder molding or liquid molding.

FIG. 3J schematically illustrates that the semiconductor chips 13, 40 encapsulated in the encapsulation material 15 are released from the carrier 10. For this purpose, the adhesive tape 30 may feature thermo-release properties, which allow the removal of the adhesive tape 30 and the carrier 10 during a heat-treatment. The removal of the adhesive tape 30 and the carrier 10 from the dielectric layer 11 is carried out at an appropriate temperature, which depends on the thermo-release properties of the adhesive tape 30 and is usually higher than 150° C. A work piece 50 is obtained by the removal of the carrier 10 and the adhesive tape 30.

FIG. 3K schematically illustrates that the devices 300 are separated from one another by dicing the work piece 50. Dicing the work piece 50 may, for example, be performed by using sawing, cutting, milling, etching or a laser beam.

The portions of the first face 22 of the seed layer 21, which are exposed by the through-holes 31 in the dielectric layer 11, form external contact pads 24 of the devices 300. The external contact pads 24 are electrically coupled to the contact pads 14, 42 of the semiconductor chips 13, 40 via the seed layer 21 and the galvanically grown metal layer 20. Thus, the external contact pads 24 allow to electrically access the integrated circuits integrated in the semiconductor chips 13, 40. The dielectric layer 11 has the function of a solder stop layer.

The devices 300 manufactured by the method described above may be fan-out type packages. The encapsulation material 15 allows the redistribution layer formed by the seed layer 21 and the metal layer 20 to extend beyond the outline of the semiconductor chips 13, 40. The external contact pads 24 therefore do not need to be arranged within the outline of the semiconductor chips 13, 40, but can be distributed over a larger area. The increased area which is available for arrangement of the external contact pads 24 as a result of the encapsulation body 15 means that the external contact pads 24 cannot only be arranged at a great distance from one another, but that the maximum number of external contact pads 24 which can be arranged there is likewise increased compared to the situation when all the external contact pads 24 are arranged within the outline of the semiconductor chips 13, 40.

The manufacturing method described above where the semiconductor chips 13, 40 are applied to the redistribution layer (instead of applying the redistribution layer to the semiconductor chips) allows to have conductor lines with reduced lateral dimensions. For example, the widths of the conductor lines formed of the structured seed layer 21 and the metal layer 20 as well as the spacings between adjacent conductor lines may be as small as 1 µm. The reason is that the semiconductor chips 13, 40 are mounted on the redistribution layer before the semiconductor chips 13, 40 are covered with the encapsulation material 15. If the semiconductor chips 13, 40 are covered with the encapsulation material 15 before the redistribution layer is produced, the semiconductor chips 13, 40 would be laterally shifted during the encapsulation process which would require larger width of the conductor lines and larger spacings between adjacent conductor lines.

It is obvious to a person skilled in the art that the devices 300 shown in FIG. 3K and the manufacturing thereof as described above are only intended to be an exemplary embodiment, and many variations are possible. Each of the devices 300 described above contains a single semiconductor chip. Alternatively, two or more semiconductor chips or passives of different types may be included in the same device 300. The semiconductor chips and passives may differ in function, size, manufacturing technology etc. Furthermore, the redistribution layer of the devices 300 includes only one layer of conductor tracks. Alternatively, two or more layers of conductor tracks may be provided. These layers may be stacked on top of each other, and dielectric layers may be arranged between adjacent layers of conductor tracks.

According to one embodiment, the dielectric layer 11 is not structured when it is deposited on the carrier 10 (see FIG. 3B). Instead, the dielectric layer 11 has an essentially planar upper face. The metal layer 12, which may, for example, consist of the seed layer 21 and the galvanically grown metal layer 20 or, alternatively, a single metal layer, is then applied to the essentially planar upper face of the dielectric layer 11 and is structured. In this embodiment, the through-holes 31 with the diameter $d_1$ are formed in the dielectric layer 11 after the carrier 10 has been removed (see FIG. 3J). The through-holes 31 may be fabricated using a laser beam.

Figure 4A:
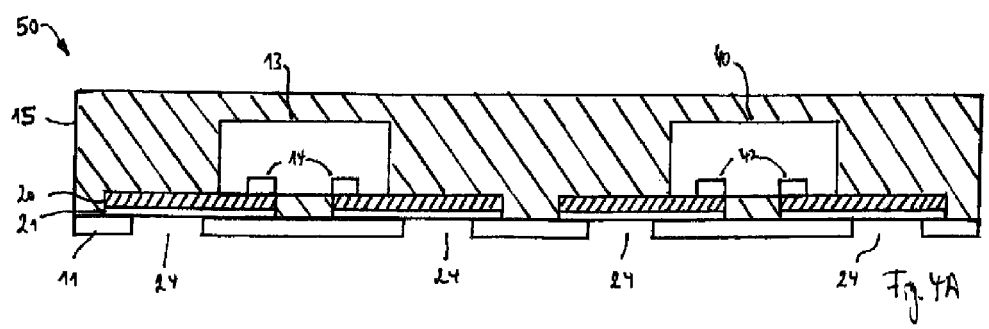
FIGS. 4A-4H schematically illustrate a cross-sectional view of one embodiment of a method including encapsulating a semiconductor chip in an encapsulation body, producing vias in the encapsulation body and applying a redistribution layer to the encapsulation body.
Figure 4B:
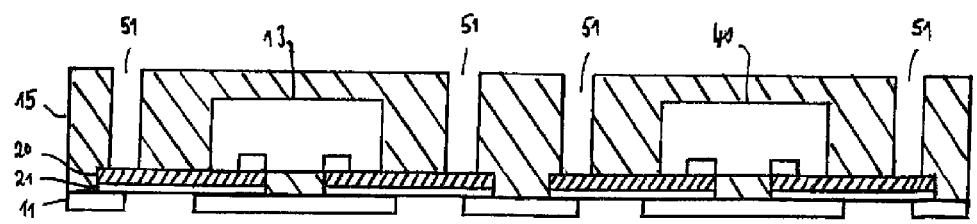
Figure 4C:
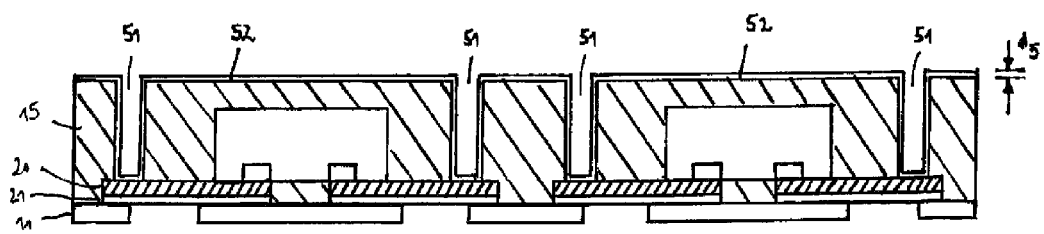
Figure 4D:
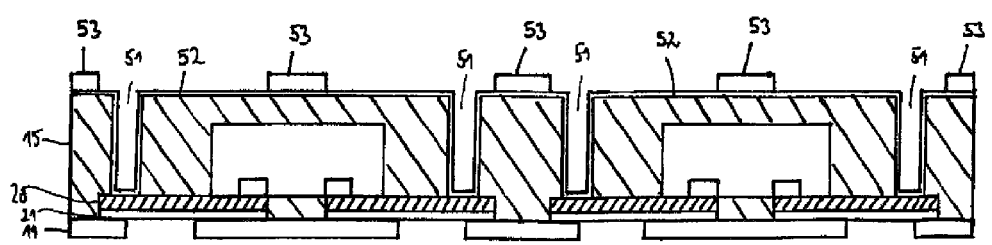
Figure 4E:
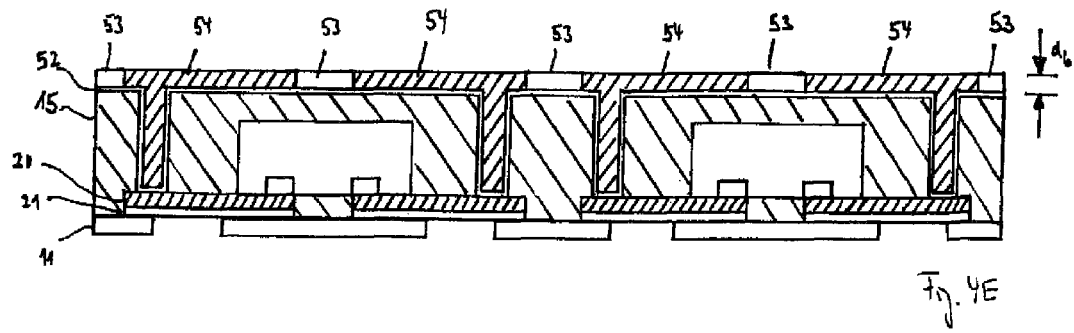
Figure 4F:
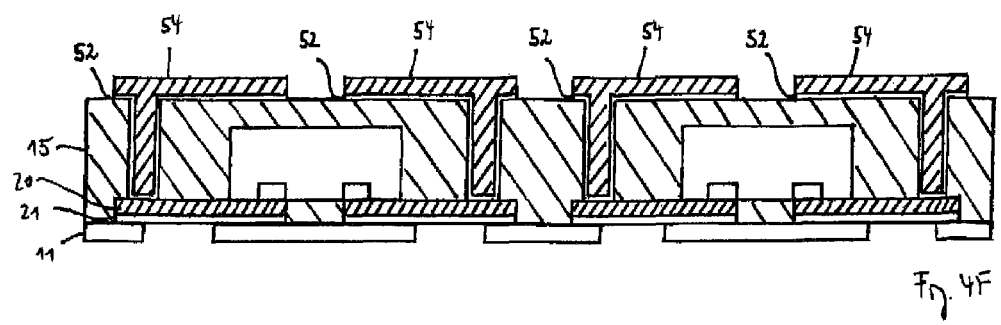
Figure 4G:
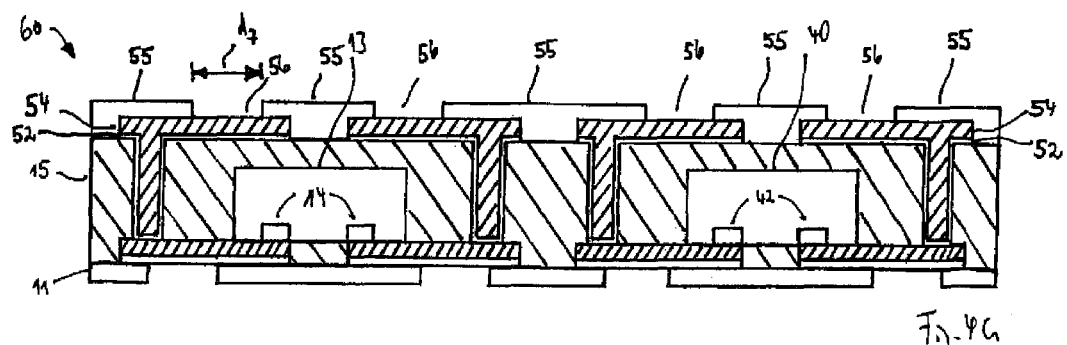
Figure 4H:
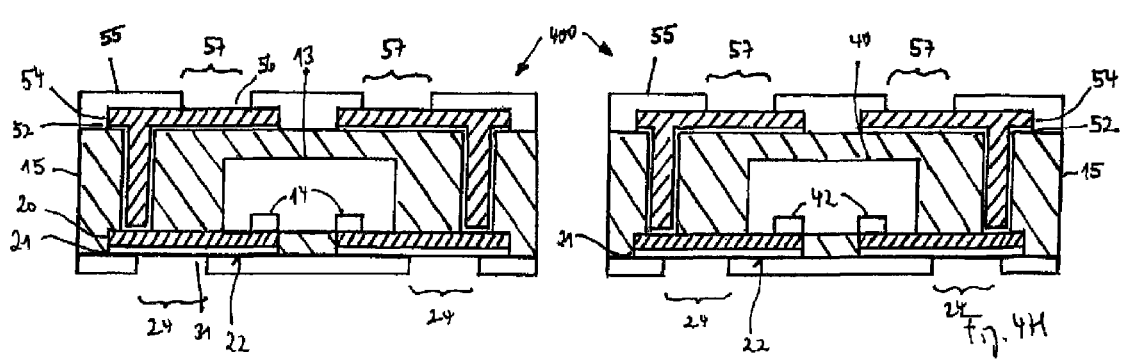

FIGS. 4A-4H schematically illustrate a method for manufacturing a device 400, a cross section of which is shown in FIG. 4H. The method shown in FIGS. 4A-4H is a variation of the method shown in FIGS. 3A-3K. Many of the manufacturing steps of the method presented below are similar or identical to the manufacturing steps described above. Therefore it is referred to the description of the method of FIGS. 3A-3K in the following where appropriate.

FIG. 4A schematically illustrates the work piece 50 of FIG. 3J. The manufacturing of the work piece 50 may be identical or similar to the manufacturing steps described above and illustrated in FIGS. 3A-3J.

FIG. 4B schematically illustrates through-holes 51 which are formed in the encapsulation material 15. The through-holes 51 extend from the upper face to the lower face of the encapsulation material 15 and expose portions of the upper face of the galvanically grown metal layer 20. The through-holes 51 may be drilled using a laser beam, an etching method or any other appropriate method.

FIG. 4C schematically illustrates a seed layer 52 which is deposited on the upper face of the encapsulation material 15 and the walls of the through-holes 51. The seed layer 52 may consist of platinum, palladium, titanium, copper or any other appropriate metal or metal alloy and may be deposited by electroless deposition, sputtering, evaporation or any other suitable technique. The seed layer 52 may have a thickness $d_5$ in the range from 50 nm to several hundred nanometer.

FIG. 4D schematically illustrates a photoresist layer 53 which may be printed, electro-deposited or spin-coated on the seed layer 52. By exposure to light having a suitable wavelength through a mask and subsequent development or laser application, recesses are formed in the photoresist layer 53 which expose portions of the seed layer 52.

FIG. 4E schematically illustrates a metal material 54 which is galvanically deposited and reinforces the portions of the seed layer 52, which are exposed by the recesses in the photoresist layer 53. Copper or other metals or metal alloys may be used as the metal material 54. During the galvanic deposition of the metal material 54, the seed layer 52 may be employed as an electrode. The metal material 54 may be plated to a desired height. The layer formed of the metal material 54 may have a thickness $d_6$ of greater than 3 µm. In one embodiment, the seed layer 52 and the metal material 54 only cover the walls of the through-holes 51 in the encapsulation material 15 such that portions of the through-holes 51 remain unfilled. According to a further embodiment, the seed layer 52 and the metal material 54 fill the through-holes 51 entirely. The seed layer 52 and the metal material 54 deposited in the through-holes 51 form electrically conductive vias in the encapsulation body 15.

FIG. 4F schematically illustrates that after the plating of the metal material 54 the photoresist layer 53 is stripped away by using an appropriate solvent. The now exposed portions of the seed layer 52, which have not been covered with the metal material 54, may be removed by a brief etching step thereby creating a structured metal layer as illustrated in FIG. 4F.

FIG. 4G schematically illustrates a dielectric layer 55 which is deposited on the metal material 54 and the exposed portions of the encapsulation material 15. The dielectric layer 55 may be fabricated in various ways. For example, the dielectric layer 55 may be deposited from a gas phase or from a solution, or can be printed or laminated on the underlying structure. Furthermore, thin-film technology methods or a standard PCB industry process flow can be used for the application of the dielectric layer 55. The dielectric layer 55 may be fabricated from a polymer, such as parylene, photoresist material, imide, epoxy, epoxy resin, duroplast, silicone, silicon nitride or an inorganic, ceramic-like material, such as silicone-carbon compounds. The thickness of the dielectric layer 55 may be up to 10 µm or even higher.

The dielectric layer 55 may have through-holes 56, which may be round or square-shaped or may have any other geometry. A diameter $d_7$ of the through-holes 56 may be in the range from 100 to 400 µm or may also be outside this range. The through-holes 56 in the dielectric layer 55 may, for example, be produced by using photolithographic methods and/or etching methods after the deposition of the dielectric layer 55. According to one embodiment, the dielectric layer 55 already includes the through-holes 56 when the dielectric layer 55 is deposited. In this case, the dielectric layer 55 may be deposited by using lamination, printing or any other appropriate technique. A work piece 60 is obtained by the process steps illustrated in FIGS. 4A-4G.

FIG. 4H schematically illustrates that the devices 400 are separated from one another by dicing the work piece 60. Dicing the work piece 60 may, for example, be performed by using sawing, cutting, milling, etching or a laser beam.

The portions of the first face 22 of the seed layer 21, which are exposed by the through-holes 31 in the dielectric layer 11, form the external contact pads 24 of the devices 400. The external contact pads 24 are electrically coupled to the contact pads 14, 42 of the semiconductor chips 13, 40 via the seed layer 21 and the galvanically grown metal layer 20. Thus, the external contact pads 24 allow to electrically access the integrated circuits integrated in the semiconductor chips 13, 40. The dielectric layer 11 has the function of a solder stop layer.

The portions of the upper face of the metal layer 54, which are exposed by the through-holes 56 in the dielectric layer 55, form external contact pads 57 of the devices 400. The external contact pads 57 are electrically coupled to the contact pads 14, 42 of the semiconductor chips 13, 40 via the metal layers 20, 54 and the seed layers 21, 52. Thus, the external contact pads 57 allow to electrically access the integrated circuits integrated in the semiconductor chips 13, 40. The dielectric layer 55 has the function of a solder stop layer.

Figure 5:
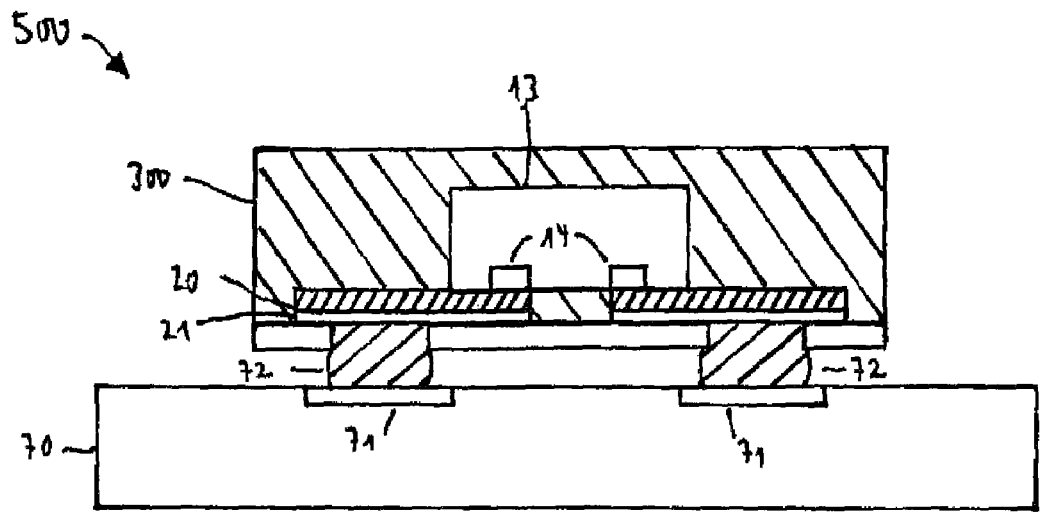
FIG. 5 schematically illustrates a cross-sectional view of one embodiment of a system including a circuit board and a device mounted on the circuit board.

FIG. 5 schematically illustrates a system 500 which includes the device 300 mounted on a circuit board 70, for example, a PCB. The circuit board 70 may have contact pads 71, and the device 300 may be soldered to the contact pads 71 by means of solder balls 72.

Figure 6:
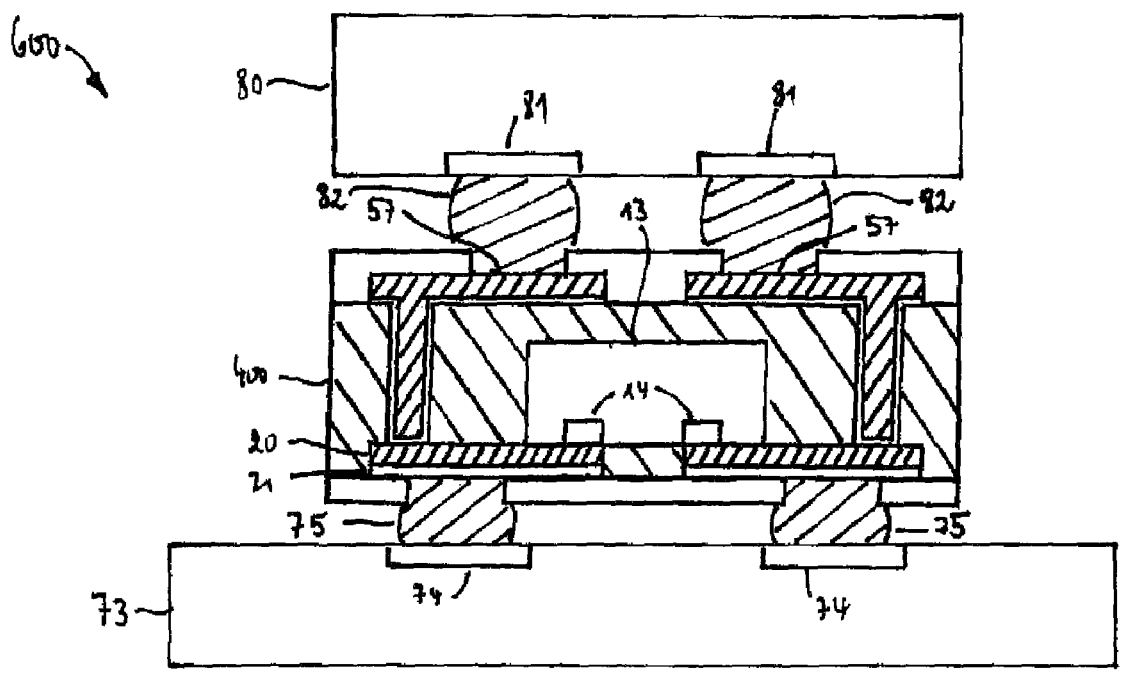
FIG. 6 schematically illustrates a cross-sectional view of one embodiment of a system including two devices stacked on top of each other and mounted on a circuit board.

FIG. 6 schematically illustrates a system 600 which includes the device 400 mounted on a circuit board 73, for example, a PCB. The circuit board 73 may have contact pads 74, and the device 400 may be soldered to the contact pads 74 by means of solder balls 75. The system further includes a device 80, which may, for example, include one or more semiconductor chips. These semiconductor chips can electrically be accessed via external contact pads 81. The device 80 is stacked on top of the device 400 such that the external contact pads 81 of the device 80 face the external contact pads 57 of the device 400. The external contact pads 81 of the device 80 may be soldered to the external contact pads 57 of the device 400 by means of solder balls 82.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    applying a dielectric layer to a carrier;
    patterning the dielectric layer for openings for external contact pads;
    applying a metal layer to the dielectric layer;
    placing a first semiconductor chip on the metal layer so that contact pads of the first semiconductor chip face the metal layer;
    covering the first semiconductor chip with an encapsulation material; and
    removing the carrier to expose the patterned dielectric layer comprising the openings for the external contact pads.

2. The method of claim 1, further comprising placing a second semiconductor chip on the metal layer and covering the second semiconductor chip with the encapsulation material.

3. The method of claim 2, further comprising separating the first and second semiconductor chips from each other by partially removing the encapsulation material.

4. The method of claim 1, further comprising applying an adhesive tape to the carrier before the dielectric layer is applied to the carrier.

5. The method of claim 1, wherein the dielectric layer is structured.

6. The method of claim 1, wherein the dielectric layer comprises a solder stop layer.

7. The method of claim 1, wherein the metal layer is structured.

8. The method of claim 7, wherein a thickness of the metal layer is increased by galvanic deposition of metal material after structuring the metal layer.

9. The method of claim 1, wherein the metal layer is applied to the dielectric layer by laminating a metal foil onto the dielectric layer.

10. The method of claim 1, wherein the contact pads of the first semiconductor chip are electrically coupled to the metal layer.

11. The method of claim 10, wherein the contact pads of the first semiconductor chip are electrically coupled to the metal layer by at least one of soldering, sintering metal particles and/or gluing using an electrically conductive adhesive.

12. The method of claim 1, wherein portions of a face of the metal layer facing away from the first semiconductor chip serve as external contact pads.

13. The method of claim 1, further comprising applying a further metal layer to the encapsulation material.

14. The method of claim 13, wherein portions of the further metal layer serve as further external contact pads.

15. A method, comprising;
applying a dielectric layer to a carrier;
patterning the dielectric layer for openings for external contact pads;
applying a metal layer to the dielectric layer;
placing a first semiconductor chip on the metal layer so that contact pads of the first semiconductor chip face the metal layer;
covering the first semiconductor chip with an encapsulation material;
removing the carrier to expose the patterned dielectric layer comprising the openings for the external contact pads; and
forming a through-hole in the encapsulation material.

16. The method of claim 15, further comprising at least partially filling the through-hole with a metal material.

17. A method of forming a device, the method comprising:
applying a dielectric layer to a carrier;
patterning the dielectric layer for openings for external contact pads;
forming a seed layer over the patterned dielectric layer, the seed layer having a first face and a second face opposite to the first face, wherein the first face of the seed layer forms the external contact pads;
applying a galvanically grown metal layer to the second face of the seed layer; and
providing a semiconductor chip comprising contact pads, wherein the contact pads are in contact with the galvanically grown metal layer; and
removing the carrier to expose the patterned dielectric layer comprising the openings for the external contact pads.

18. The method of claim 17, further comprising encapsulating the semiconductor chip within an encapsulation body.

19. The method of claim 18, further comprising depositing forming vias in the encapsulation body.

20. The method of claim 18, wherein the encapsulation body has a first face and a second face, wherein the external contact pads are arranged an the first face of the encapsulation body, the method further comprising forming a further metal layer on the second face of the encapsulation body.

21. The method of claim 20, further comprising forming vias in the encapsulation body so that the vias electrically couple the further metal layer to the contact pads of the semiconductor chip.

22. The method of claim 17, wherein applying the galvanically grown metal layer comprises applying the galvanically grown metal directly onto the second face of the seed.

* * * * *

UNITED STATES PATENT AND TRADEMARK OFFICE
CERTIFICATE OF CORRECTION

PATENT NO. : 8,338,231 B2
APPLICATION NO. : 12/749192
DATED : December 25, 2012
INVENTOR(S) : Meyer-Berg Page 1 of 1

It is certified that error appears in the above-identified patent and that said Letters Patent is hereby corrected as shown below:

In the Claims

In Col. 12, line 19, claim 19, delete "depositing".
In Col. 12, line 22, claim 20, after "second face" insert --opposite to the first face--.

Signed and Sealed this
Sixteenth Day of July, 2013

Teresa Stanek Rea
*Acting Director of the United States Patent and Trademark Office*